United States Patent
Hsu et al.

(10) Patent No.: US 9,064,081 B1
(45) Date of Patent: Jun. 23, 2015

(54) GENERATING DATABASE FOR CELLS ROUTABLE IN PIN LAYER

(71) Applicant: Taiwan Semiconductor Manufacturing Company Ltd., Hsinchu (TW)

(72) Inventors: Meng-Kai Hsu, Hsinchu County (TW); Chi-Yeh Yu, Hsinchu (TW); Yuan-Te Hou, Hsinchu (TW); Wen-Hao Chen, Hsin-Chu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/103,558

(22) Filed: Dec. 11, 2013

(51) Int. Cl.
*G06F 17/50* (2006.01)

(52) U.S. Cl.
CPC ........ *G06F 17/5077* (2013.01); *G06F 17/5072* (2013.01); *G06F 17/5068* (2013.01); *G06F 17/5081* (2013.01)

(58) Field of Classification Search
CPC ............ G06F 17/5072; G06F 17/5068; G06F 17/5077; G06F 17/5081
USPC .......... 716/118–119, 122–123, 126, 129–130
See application file for complete search history.

(56) References Cited

U.S. PATENT DOCUMENTS

| | | | |
|---|---|---|---|
| 6,230,299 B1* | 5/2001 | McSherry et al. | 716/115 |
| 6,701,509 B2* | 3/2004 | Aggarwal et al. | 716/120 |
| 7,571,408 B1* | 8/2009 | Ylinen et al. | 716/119 |
| 8,015,529 B1* | 9/2011 | Ylinen et al. | 716/115 |
| 8,151,239 B1* | 4/2012 | Wadland et al. | 716/130 |
| 8,332,793 B2* | 12/2012 | Bose | 716/114 |
| 8,347,257 B2* | 1/2013 | Alpert et al. | 716/126 |
| 8,627,247 B1* | 1/2014 | McCullen et al. | 716/103 |
| 8,726,217 B2* | 5/2014 | Gullette | 716/126 |
| 2003/0051217 A1* | 3/2003 | Cheng | 716/5 |
| 2005/0076319 A1* | 4/2005 | Chow et al. | 716/10 |
| 2006/0129962 A1* | 6/2006 | Dinter et al. | 716/11 |
| 2008/0092099 A1* | 4/2008 | Lin et al. | 716/8 |
| 2008/0216038 A1* | 9/2008 | Bose | 716/8 |
| 2009/0254874 A1* | 10/2009 | Bose | 716/6 |
| 2009/0300565 A1* | 12/2009 | Chiu et al. | 716/6 |
| 2010/0125822 A1* | 5/2010 | Lepere et al. | 716/10 |
| 2010/0199252 A1* | 8/2010 | Torvi et al. | 716/12 |
| 2012/0060139 A1* | 3/2012 | Keinert et al. | 716/126 |
| 2012/0110536 A1* | 5/2012 | Agarwal et al. | 716/129 |
| 2012/0192135 A1* | 7/2012 | Gullette | 716/113 |
| 2013/0086544 A1* | 4/2013 | Alpert et al. | 716/129 |
| 2013/0212549 A1* | 8/2013 | Maziasz et al. | 716/119 |
| 2014/0289695 A1* | 9/2014 | Yoshida et al. | 716/136 |

\* cited by examiner

*Primary Examiner* — Stacy Whitmore
(74) *Attorney, Agent, or Firm* — WPAT, P.C.; Anthony King; Kay Yang

(57) ABSTRACT

A method of wire routing is provided. The method comprises obtaining data of cell layouts, generating a first database for the cell layouts, identifying, for each cell in the first database, whether the cell and another cell in the first database are routable in a pin layer, and generating a second database for routable cells.

13 Claims, 6 Drawing Sheets

GENERATING DATABASE FOR CELLS ROUTABLE IN PIN LAYER

BACKGROUND

In the design of semiconductor integrated circuits (ICs), placement and routing is a stage to determine the layout of an IC, which includes a geometric description of the location of each IC component, and the path of each wire connecting the IC components. In the placement and routing stage, placement is generally conducted before routing. Placement involves deciding where to place all IC components, circuitry and logic gates in a limited amount of space, and routing decides the exact design of all the wires needed to connect the placed components.

BRIEF DESCRIPTION OF THE DRAWINGS

The details of one or more embodiments of the disclosure are set forth in the accompanying drawings and the description below. Other features and advantages of the disclosure will be apparent from the description, drawings and claims.

Like reference symbols in the various drawings indicate like elements.

DETAILED DESCRIPTION

Figure 1:
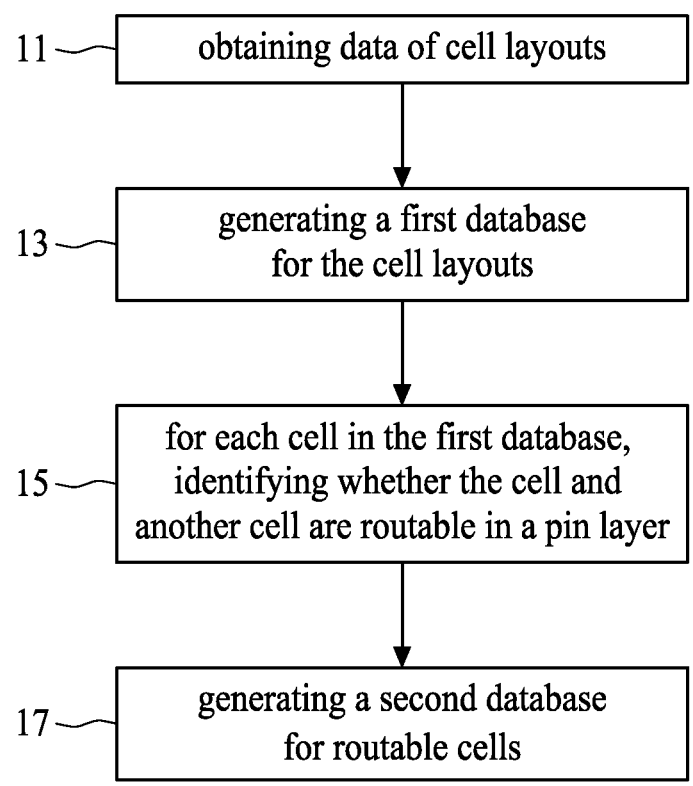
FIG. 1 is a flow diagram illustrating a method of generating a database for cells routable in a pin layer in accordance with some embodiments.

Embodiments, or examples, of the disclosure illustrated in the drawings are now described using specific language. It will nevertheless be understood that no limitation of the scope of the disclosure is thereby intended. Any alterations and modifications in the described embodiments, and any further applications of principles described in this document are contemplated as would normally occur to one of ordinary skill in the art to which the disclosure relates. Reference numerals may be repeated throughout the embodiments, but this does not necessarily require that feature(s) of one embodiment apply to another embodiment, even if they share the same reference numeral. It will be understood that when an element is referred to as being "connected to" or "coupled with" another element, it may be directly connected to or coupled to the other element, or intervening elements may be present.

Some embodiments have one or a combination of the following features and/or advantages. In some embodiments, a database for cells that are routable in a pin layer is established. In other embodiments, based on the database, a layout of a design or an integrated circuit (IC) is modified to facilitate wire routing. As a result, a relatively low metal layer, such as M1 layer, is used in wire routing. Moreover, a smaller area or fewer metal layers are required in the wire routing without compromising yield of the design.

FIG. 1 is a flow diagram illustrating a method of generating a database for cells routable in a pin layer in accordance with some embodiments. Referring to FIG. 1, in operation 11, data of cell layouts are obtained. In some embodiments, a cell in semiconductor design includes a group of transistor and interconnect structures, which provides a Boolean logic function or a storage function. Examples of the cell may include elemental AND, OR, NAND, NOR, and XOR Boolean functions, full-adder, and flip flop. Furthermore, the cell includes a multi-layer structure with a pin layer atop for connection with other cells. Metal shapes in the pin layer of the cell can serve as ports or pins for connection, and are arranged in a topology called the layout of the cell.

In some embodiments, the data of cell layouts are obtained from a netlist, which includes information on the connectivity of cells. The netlist is a gate level netlist file obtained by synthesizing a register-transfer level (RTL) file. In digital circuit design, RTL is a design abstraction which models a synchronous digital circuit in terms of the flow of digital signals or data between hardware registers, and the logical operations performed on those signals. Furthermore, RTL abstraction is used in hardware description languages (HDLs) like Verilog and VHDL to create high-level representations of a circuit, from which lower-level representations and ultimately actual wiring can be derived. The netlist contains descriptions of the parts or devices used. These definitions will usually list the connections that can be made to that kind of device, and some basic properties of that device. The connection points are called "ports" or "pins."

In operation 13, a first database or file for the cell layouts is generated. In some embodiments, cells in the first database have a pin layer at the same layer as metal-1 (M1) layer. M1 layer is merely exemplary for convenience of discussion and should not be construed as limiting the present disclosure. Other metal layers, such as M2 or higher layer in a back-end-of-line (BEOL) processing, are within the contemplated scope of the present disclosure. In semiconductor manufacturing, once various semiconductor devices have been created in a substrate, they are interconnected to form the desired electrical circuits. The interconnection processing involves creating metal interconnecting wires that are isolated by dielectric layers. The M1 layer refers to a metal interconnecting layer in closest proximity to the substrate among the metal interconnecting wires. Establishment of the first database facilitates wire routing for cells in a pin layer, as will be further discussed.

Next, in operation 15, for each cell in the first database, whether the cell and another cell in the first database are routable in a pin layer is identified. To identify whether two cells are routable, design constraints of connection between the cells are taken into consideration. The design constraints may include limitations on speed and space for cells to be connected. In some embodiments, for example, a design rule check (DRC) is performed for the identification. Accordingly, when two cells abut each other, if their pins cannot be connected using the same pin layers without violating the DRC, these cells are determined to be not routable. On the contrary, if the distance between the pins of two cells conforms to the DRC, these cells are determined to be routable.

In operation 17, a second database or file for the routable cells is generated. The second database includes not only cells routable in M1 layer, but also cells routable in M2 or higher layer in the case that the pin layers of the cells are in the M2 or higher layer. In the second database, routable cells are listed in pairs, as will be discussed with reference to FIG. 2A below. Moreover, a cell may be routable with more than one other cells. In some embodiments, the second database is generated before wire routing.

Figure 2A:
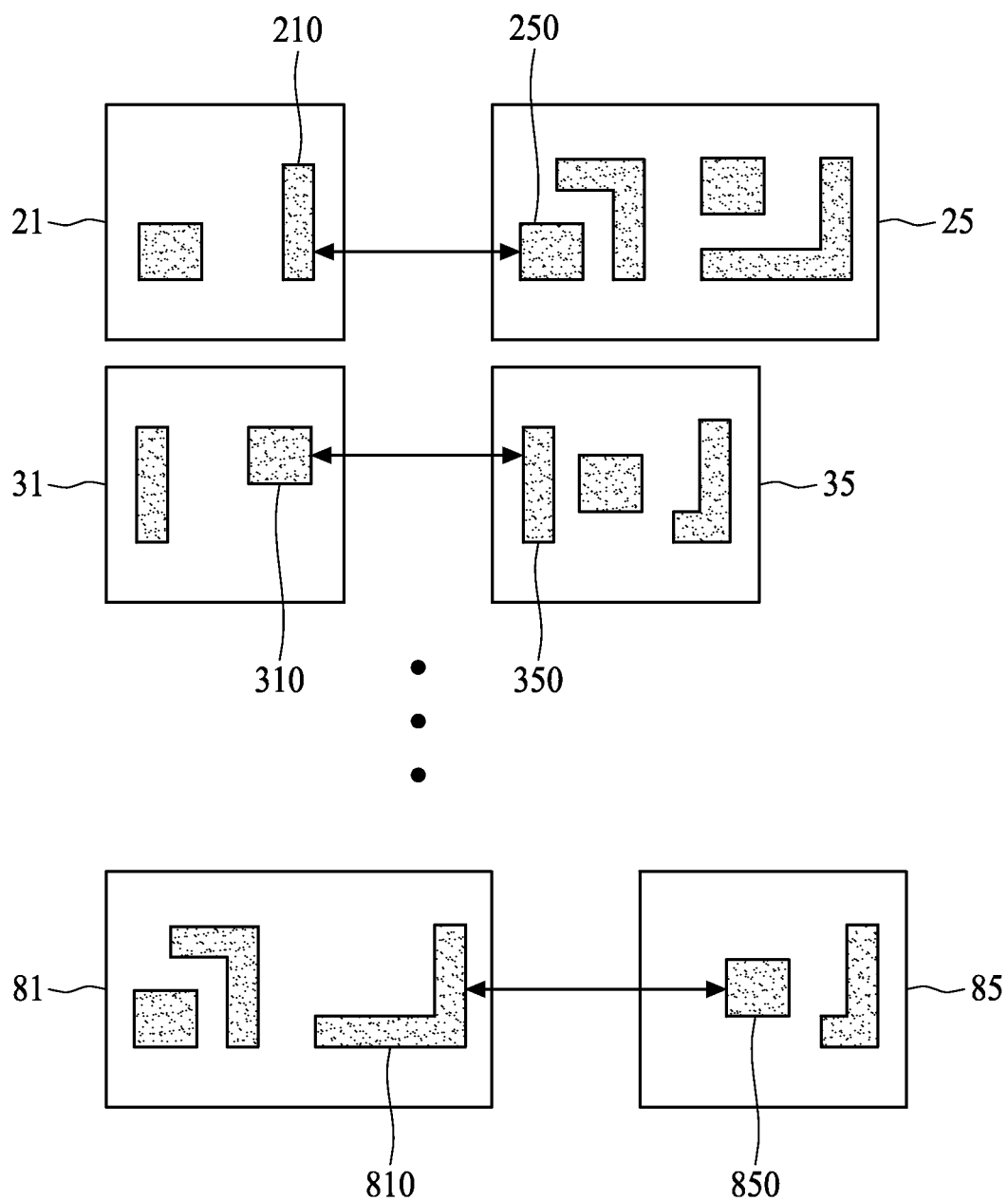
FIGS. 2A and 2B are schematic diagrams illustrating operations of the method in FIG. 1 in accordance with some embodiments.
Figure 2B:
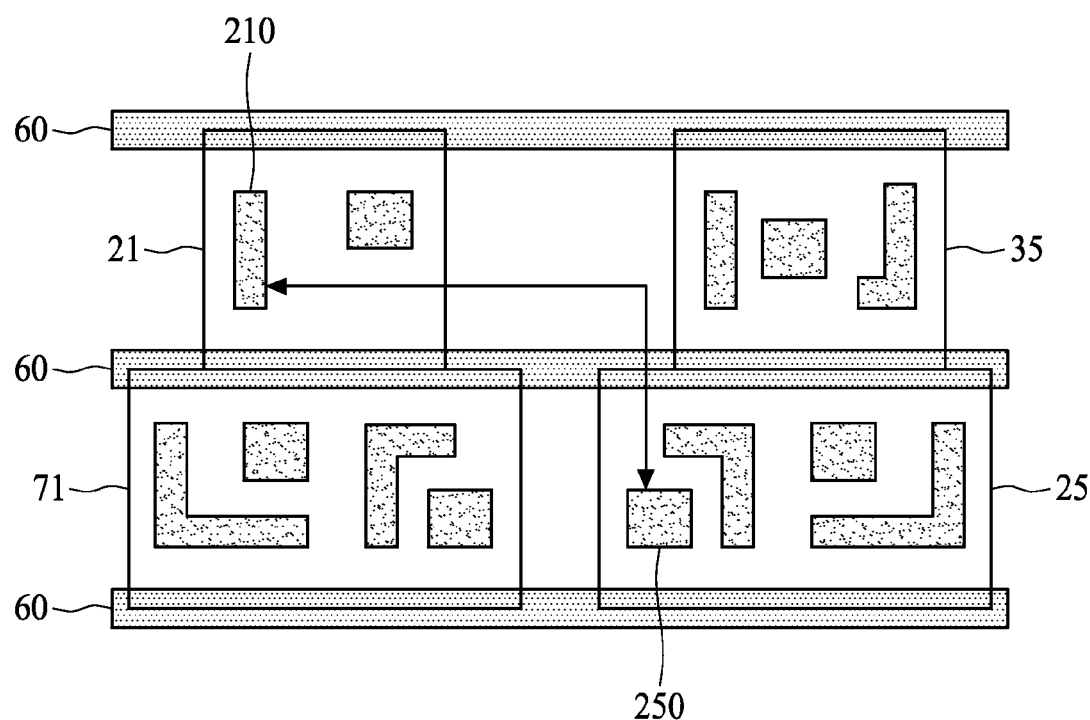

FIGS. 2A and 2B are schematic diagrams illustrating operations of the method in FIG. 1 in accordance with some embodiments. Referring to FIG. 2A, for illustration purpose, layouts of cells 21, 25, 31, 35, 81 and 85 in the second database are shown. By the operation 15 in FIG. 1, it is identified that a pin 210 of cell 21 to be connected to a pin 250 of cell 25, or vice versa, conforms to the design constraints. Accordingly, cells 21 and 25 are routable. Also, cells 31 and 35 are routable because connection between a pin 310 of cell 31 and a pin 350 of cell 35 conforms to the design constraints. Moreover, cells 81 and 85 are routable because connection between a pin 810 of cell 81 and a pin 850 of cell 85 conforms to the design constraints. As a result, cells 21, 31 and 81 are routable with cells 25, 35 and 85, respectively.

Referring to FIG. 2B, a relative position of cells 21, 35, 71 and 25 after, for example, an initial placement is shown. These cells have their respective pin layers at M1 layer 60. Moreover, these cells may have irregular pin shapes or complex pin topology. Assume that cell 21 is to be connected to cell 25. Since cells 21 and 25 do not abut, and directly connecting pins on cells 21 and 25 would violate the design constraints due to a long connection distance or complicated pin shape, in some existing approaches, cells 21 and 25 are connected to each other via M2 and even M3 and higher layers. In embodiments according to the present disclosure, however, based on the information on the routable cells in the second database, one of cells 21 and 25 is adjusted by, relocation or re-orientation, so that cells 21 and 25 are connected in M1 layer 60 without using M2 or higher layer, as will be discussed with reference to FIG. 3 below.

Figure 3:
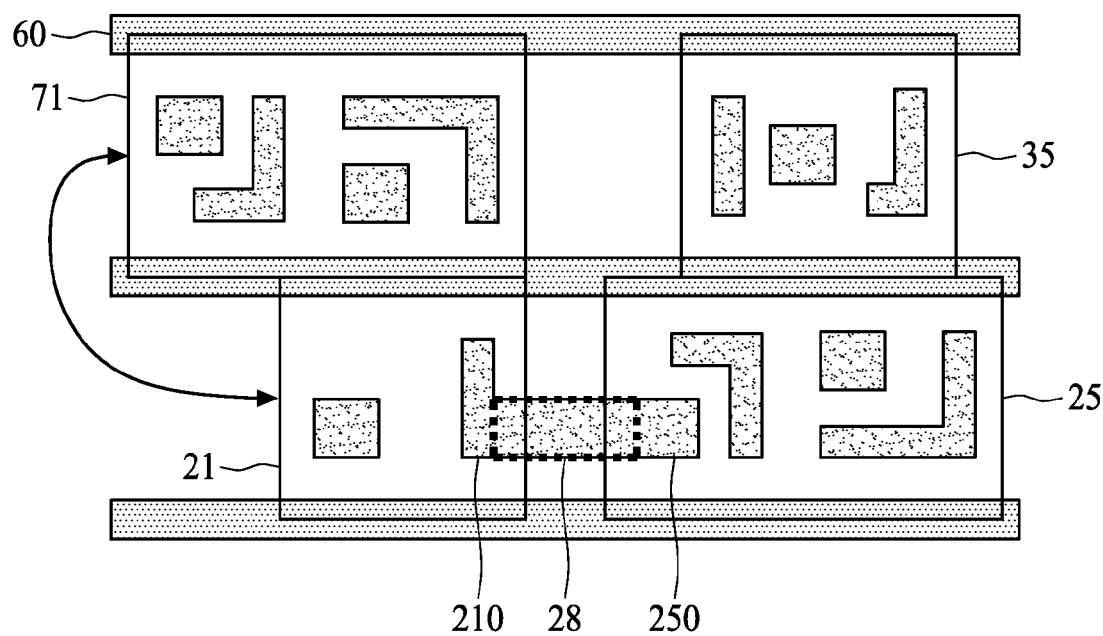
FIG. 3 is a schematic diagram illustrating a method of routing in accordance with some embodiments.

FIG. 3 is a schematic diagram illustrating a method of routing in accordance with some embodiments. Referring to FIG. 3, and also referring to FIG. 2B, to adjust the cell position, the locations of cells 21 and 71 are exchanged so that cell 21 is more closer to cell 25. In the present embodiment, cells 21 and 25 are aligned to each other. Moreover, cell 21 is reoriented so that pin 210 of cell 21 and pin 250 of cell 25 are immediately adjacent to each other. The adjusted position matches a routable pair of cells 21 and 25 in the second database. A connector 28 is then added between pins 210 and 250 in a subsequent wire routing process to connect cells 21 and 25. As a result, cells 21 and 25 are connected to each other at M1 layer, their pin layer.

Figure 4:
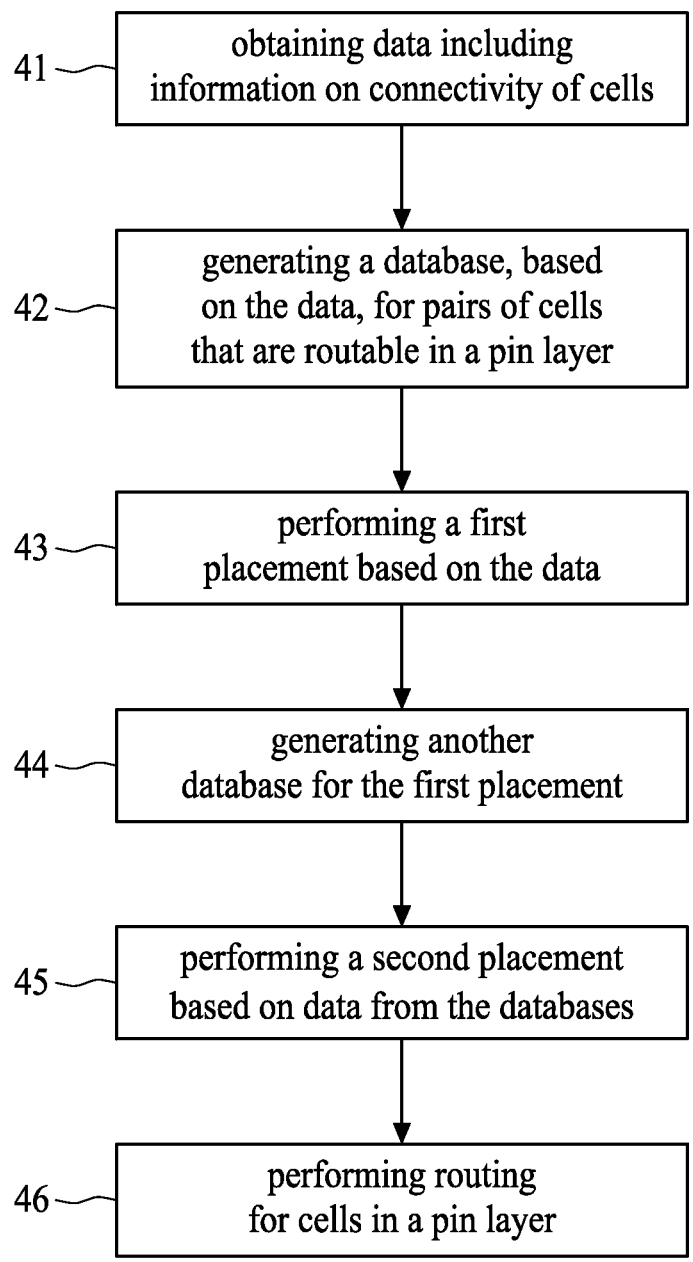
FIG. 4 is a flow diagram illustrating a method of routing in accordance with some embodiments.

FIG. 4 is a flow diagram illustrating a method of routing in accordance with some embodiments. Referring to FIG. 4, in operation 41, data including information on connectivity of cells are obtained. In some embodiments, the data include a netlist and may further include a floor plan and a synopsys design constraint (SDC) file. SDC is used to constraint the design and to get the netlist of the design. SDC contains clock information, false path and multi cycle path, cap, fanout and transition values. In designing an IC chip, a designer at a system design stage describes the IC chip in terms of larger modules that serve specific functions. Further, exploration for options include design architectures is performed to consider, for example, tradeoffs in optimizing design specifications and cost. At a logic design stage, the modules for the IC chip are described at the RTL using Verilog or VHDL, and are verified for functional accuracy. Subsequently, at a logic synthesis stage, the modules for the IC chip described in RTL is translated into a gate-level netlist. Next, the gate-level netlist is partitioned into blocks and a floor plan for the blocks is created.

In operation 42, a database for cells that are routable in a pin layer is generated based on the data. The database is same as or similar to the second database described with reference to FIG. 1 and thus establishment of the database is not further discussed.

In operation 43, a first or an initial placement of cells is performed according to the data. After the first placement, which may be deemed a rough placement, there may exist cells that violate the design constraints. A result of the first placement is stored in another database in operation 44.

In operation 45, a second placement is performed, using the data from the database for routable cells and data of the first placement. The second placement, which may be deemed a fine placement or a routing-aware placement, adjusts those cells that violate the design constraints by relocating or re-orientating the cells.

Next, in operation 46, a routing process is performed to connect cells in a pin layer. In some embodiments, also referring to FIG. 3, adjusted cells are connected by connector 28 in the routing process. As a result, since most cells have a pin layer at M1 layer, wire routing for these cells is performed at M1 layer. Further, for cells having a pin layer at M2 layer, wire routing for such cells is performed using M1 and M2 layers.

Figure 5:
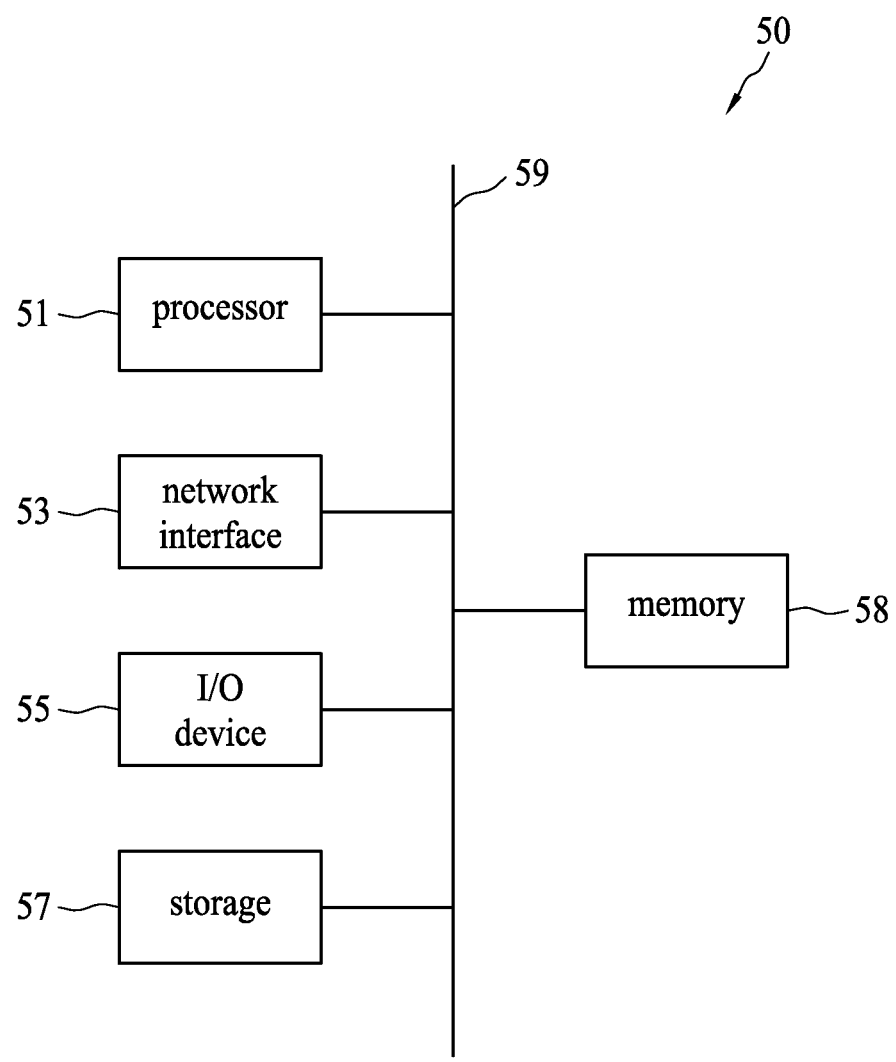
FIG. 5 is a block diagram of a system for placement and routing in accordance with some embodiments.

FIG. 5 is a block diagram of a system 50 for placement and routing in accordance with some embodiments. Referring to FIG. 5, system 50 includes a processor 51, a network interface 53, an input and output (I/O) device 55, a storage 57, a memory 58, and a bus 59. The bus 59 couples the network interface 53, the I/O device 55, the storage 57 and the memory 58 to the processor 51.

Processor 51 is configured to execute program instructions that include a tool configured to perform the method for wire routing as described and illustrated with reference to FIG. 1. Accordingly, the tool is configured to obtain data of cell layouts, generate a first database for the cell layouts, identify for each cell in the first database whether the cell and another cell are routable in a pin layer, and generate a second database for routable cells. Moreover, the tool is configured to perform the method for wire routing as described and illustrated with reference to FIG. 4. Accordingly, the tool is configured to obtain data including information on connectivity of cells, generate a database, based on the data, for pairs of cells that are routable in a pin layer, perform a first placement based on the data, generate another database for a result of the first placement, and perform a second placement based on the data from the database for pairs of cells that are routable in a pin layer and the database for a result of the first placement.

Network interface 53 is configured to access program instructions and data accessed by the program instructions stored remotely through a network (not shown).

I/O device 55 includes an input device and an output device configured for enabling user interaction with system 50. In some embodiments, the input device comprises, for example, a keyboard, a mouse, etc. Moreover, the output device comprises, for example, a display, a printer, etc.

Storage device 57 is configured for storing program instructions and data accessed by the program instructions. In some embodiments, storage device 57 comprises, for example, a magnetic disk and an optical disk.

Memory 58 is configured to store program instructions to be executed by processor 51 and data accessed by the program instructions. In some embodiments, memory 58 comprises a random access memory (RAM) and/or some other volatile storage device and/or read only memory (ROM) and/ or some other non-volatile storage device.

Embodiments of the present disclosure provide a method of wire routing. The method comprises obtaining data of cell layouts, generating a first database for the cell layouts, identifying, for each cell in the first database, whether the cell and another cell in the first database are routable in a pin layer, and generating a second database for routable cells.

In an embodiment, the method further comprises obtaining the data of cell layouts from a netlist.

In another embodiment, identifying for each cell in the first database includes determining whether a connection relationship between the cell and another cell conforms to design constraints. In yet another embodiment, identifying for each cell in the first database includes performing a design rule check (DRC).

In an embodiment, the pin layer includes a metal layer in closest proximity to a substrate.

In another embodiment, the method further comprises obtaining data including information on connectivity of cells before obtaining data of cell layouts. Moreover, the method further comprises performing a first placement based on the data including information on connectivity of cells, generating a third database for the first placement, and performing a second placement based on data from the second database and third database.

In still another embodiment, the method further comprises adjusting cells in position in accordance with data in the second database. Furthermore, adjusting cells includes at least one of relocating one of the cells or re-orientating one of the cells.

In yet still another embodiment, the method further comprises adding a connector for connecting cells after adjusting cells.

Some embodiments of the present disclosure provide a method of wire routing. The method comprises obtaining data including information on connectivity of cells, generating a database, based on the data, for pairs of cells that are routable in a pin layer, performing a first placement based on the data and generating another database for a result of the first placement, and performing a second placement based on data from the database for pairs of cells that are routable in a pin layer and the database for a result of the first placement.

In an embodiment, the method further comprises adjusting cells in position in accordance with data in the database for pairs of cells that are routable in a pin layer. Moreover, adjusting cells includes at least one of relocating one of the cells or re-orientating one of the cells.

In another embodiment, the method further comprises adding a connector for connecting cells after adjusting cells.

In still another embodiment, in generating a database for pairs of cells that are routable in a pin layer, the method comprises obtaining data of cell layouts from the data including information on connectivity of cells, generating a first database for the cell layouts, and identifying, for each cell in the first database, whether the cell and another cell in the first database are routable in a pin layer.

In an embodiment, identifying for each cell in the first database includes determining whether a connection relationship between the cell and another cell conforms to design constraints.

Embodiments of the present disclosure also provide a system for wire routing. The system comprises a processor configured to execute program instructions, and a memory configured to store the program instructions. The program instructions includes a tool configured to obtain data of cell layouts, generate a first database for the cell layouts, identify, for each cell in the first database, whether the cell and another cell in the first database are routable in a pin layer, and generate a second database for routable cells.

In an embodiment, the tool is further configured to obtain data including information on connectivity of cells before obtaining data of cell layouts.

In another embodiment, the tool is further configured to perform a first placement based on the data including information on connectivity of cells, generate a third database for the first placement, and perform a second placement based on data from the second database and third database.

In still another embodiment, the tool is further configured to adjust cells in position in accordance with data in the second database. Moreover, adjusting cells includes at least one of relocating one of the cells or re-orientating one of the cells.

In yet still another embodiment, the tool is further configured to add a connector for connecting cells after adjusting cells.

The foregoing outlines features of several embodiments so that persons having ordinary skill in the art may better understand the aspects of the present disclosure. Persons having ordinary skill in the art should appreciate that they may readily use the present disclosure as a basis for designing or modifying other devices or circuits for carrying out the same purposes or achieving the same advantages of the embodiments introduced therein. Persons having ordinary skill in the art should also realize that such equivalent constructions do not depart from the spirit and scope of the present disclosure, and that they may make various changes, substitutions and alternations herein without departing from the spirit and scope of the present disclosure.

What is claimed is:

1. A method of wire routing, comprising:
   obtaining data including information on connectivity of cells;
   obtaining data of cell layouts;
   generating a first database for the cell layouts;
   identifying for each cell in the first database, whether the cell and another cell in the first database respectively have pins that are routable in only a pin layer used for the pins; and
   generating, by at least one processor, a second database for routable cells;
   performing, by at the least one processor, a first placement based on the data including information on connectivity of cells;
   generating, by the at least one processor, a third database for the first placement; and
   performing, by the at least one processor, a second placement based on data from the second database and third database to generate a fourth database;
   wherein in the third database, a first pair in the pairs of cells are not positioned such that the respective pins of the first pair of cells are routable in only the pin layer; and
   in the fourth database, the first pair of cells are re-positioned such that the respective pins of the first pair of cells are routable in only the pin layer.

2. The method of claim 1 further comprising obtaining the data of cell layouts from a netlist.

3. The method of claim 1, wherein identifying for each cell in the first database includes determining whether connected pins between the cell and another cell conforms to design rule check (DRC).

4. The method of claim 1, wherein the pin layer includes a metal layer in closest proximity to a substrate.

5. The method of claim 1, wherein during performing the second placement, the first pair of cells are re-positioned by at least one of relocating one of the cells or re-orientating one of the cells.

6. The method of claim 1 further comprising adding a connector for connecting cells after performing the second placement.

7. A method of wire routing comprising:
   obtaining data including information on connectivity of cells;

generating, by at least one processor, a database, based on the data, for pairs of cells that respectively have pins that are routable in only a pin layer used for the pins;

performing, by the at least one processor, a first placement based on the data and generating another database for a result of the first placement; and performing, by the at least one processor, a second placement based on data from the database for pairs of cells that respectively have pins that are routable in only a pin layer to update the database for a result of the first placement into a database for a result of the second placement, wherein in the database for a result of the first placement, a first pair in the pairs of cells are not positioned such that the respective pins of the first pair of cells are routable in only the pin layer; and in the database for a result of the second placement, the first pair of cells are re-positioned such that the respective pins of the first pair of cells are routable in only the pin layer.

8. The method of claim 7, wherein during performing the second placement, the first pair of cells are re-positioned by at least one of relocating one of the cells or re-orientating one of the cells.

9. The method of claim 7 further comprising adding a connector for connecting cells after the second placement is performed.

10. The method of claim 7, wherein generating a database for pairs of cells that are routable in a pin layer comprises:

obtaining data of cell layouts from the data including information on connectivity of cells;

generating a first database for the cell layouts; and identifying, for each cell in the first database, whether the cell and another cell in the first database that respectively have pins that are routable in only a pin layer used for the pins.

11. A system for wire routing, comprising:

a processor configured to execute program instructions, the program instructions including a tool configured to:

obtain data including information on connectivity of cells;

obtain data of cell layouts;

generate a first database for the cell layouts;

identify, for each cell in the first database, whether the cell and another cell in the first database respectively have pins that are routable in only a pin layer used for the pins;

generate a second database for routable cells;

perform a first placement based on the data including information on connectivity of cells;

generate a third database for the first placement; and perform a second placement based on data from the second database and third database to generate a fourth database;

wherein in the third database, a first pair in the pairs of cells are not positioned such that the respective pins of the first pair of cells are routable in only the pin layer; and in the fourth database, the first pair of cells are re-positioned such that the respective pins of the first pair of cells are routable in only the pin layer; a memory configured to store the program instructions.

12. The system of claim 11, wherein during performing the second placement, the first pair of cells are re-positioned by at least one of relocating one of the cells or re-orientating one of the cells.

13. The system of claim 11, wherein the tool is further configured to add a connector for connecting cells after performing the second placement.

* * * * *